(12) United States Patent
McKiernan et al.

(10) Patent No.: US 8,440,325 B2
(45) Date of Patent: May 14, 2013

(54) ELECTRONIC DEVICE

(75) Inventors: Mary McKiernan, Cottenham (GB);
Natasha Conway, Histon (GB);
Richard Wilson, Girton (GB)

(73) Assignees: Cambridge Display Technology Limited, Cambridgeshire (GB); CDT Oxford Limited, Cambridgeshire (GB)

( * ) Notice: Subject to any disclaimer, the term of this patent is extended or adjusted under 35 U.S.C. 154(b) by 220 days.

(21) Appl. No.: 12/158,935

(22) PCT Filed: Dec. 18, 2006

(86) PCT No.: PCT/GB2006/004745
§ 371 (c)(1),
(2), (4) Date: Aug. 21, 2008

(87) PCT Pub. No.: WO2007/071957
PCT Pub. Date: Jun. 28, 2007

(65) Prior Publication Data
US 2008/0315757 A1    Dec. 25, 2008

(30) Foreign Application Priority Data

Dec. 22, 2005    (GB) .................................. 0526185.4

(51) Int. Cl.
*H01L 51/54*    (2006.01)
(52) U.S. Cl.
USPC ........... 428/690; 428/917; 313/504; 313/505; 313/506; 564/26; 564/426; 564/434; 257/40; 257/E51.05
(58) Field of Classification Search .................. 428/690, 428/917; 313/504, 505, 506; 564/26, 426, 564/434; 257/40, E51.05
See application file for complete search history.

(56) References Cited

U.S. PATENT DOCUMENTS

| | | | |
|---|---|---|---|
| 5,150,006 A | 9/1992 | Van Slyke et al. | |
| 5,432,014 A | 7/1995 | Sano et al. | |
| 5,523,555 A | 6/1996 | Friend et al. | |
| 5,621,131 A | 4/1997 | Kreuder et al. | |
| 5,723,873 A | 3/1998 | Yang | |
| 5,728,801 A * | 3/1998 | Wu et al. ....................... | 528/422 |
| 5,798,170 A | 8/1998 | Zhang et al. | |

(Continued)

FOREIGN PATENT DOCUMENTS

| | | |
|---|---|---|
| EP | 0 707 020 | 4/1996 |
| EP | 0 827 366 A2 | 3/1998 |

(Continued)

OTHER PUBLICATIONS

Bradley at al., High Mobility Hole Transport Fluorene-Triarylamine Copolymers, 1999, Advanced Materials, vol. 11, No. 3, pp. 241-246.*

(Continued)

*Primary Examiner* — Jennifer A Chriss
*Assistant Examiner* — Gregory Clark
(74) *Attorney, Agent, or Firm* — Marshall, Gerstein & Borun LLP

(57) ABSTRACT

An electronic device containing a hole transporting semiconductive polymer comprising a first repeat unit comprising a first nitrogen of a triarylamine in the polymer backbone and a second nitrogen of an arylamine pendant from the polymer backbone, characterised in that said semiconductive polymer performs the function of transporting holes to or from a semiconductive material in said device.

26 Claims, 1 Drawing Sheet

U.S. PATENT DOCUMENTS

| | | | |
|---|---|---|---|
| 6,083,634 | A | 7/2000 | Shi |
| 6,268,695 | B1 | 7/2001 | Affinito |
| 6,353,083 | B1 | 3/2002 | Inbasekaran et al. |
| 6,809,472 | B1 | 10/2004 | Carter et al. |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 7,238,435 | B2 | 7/2007 | Kamatani et al. |
| 2002/0117662 | A1 | 8/2002 | Nii |
| 2002/0182441 | A1 | 12/2002 | Lamansky et al. |
| 2003/0085886 | A1* | 5/2003 | Ide et al. ............... 345/211 |
| 2003/0165713 | A1* | 9/2003 | Oguma et al. ............ 428/690 |
| 2004/0002576 | A1 | 1/2004 | Oguma et al. |
| 2005/0007011 | A1* | 1/2005 | Cina ............... 313/504 |
| 2005/0238920 | A1 | 10/2005 | Sotoyama et al. |

FOREIGN PATENT DOCUMENTS

| | | |
|---|---|---|
| EP | 0 842 208 | 5/1998 |
| EP | 0 880 303 | 11/1998 |
| EP | 0 901 176 A2 | 3/1999 |
| EP | 0 947 123 | 10/1999 |
| EP | 0 949 850 | 10/1999 |
| EP | 1 245 659 A1 | 10/2002 |
| EP | 1 298 738 | 4/2003 |
| EP | 1 310 539 | 5/2003 |
| EP | 1 394 188 A1 | 3/2004 |
| GB | 2 348 316 | 9/2000 |
| JP | 2002-324679 | 11/2002 |
| JP | 2003/501795 A | 1/2003 |
| JP | 2003-342325 | 12/2003 |
| JP | 2004/002703 A | 1/2004 |
| WO | WO-90/13148 A1 | 11/1990 |
| WO | WO-96/16449 A1 | 5/1996 |
| WO | WO-96/20253 A1 | 7/1996 |
| WO | WO-98/06773 A1 | 2/1998 |
| WO | WO-98/10621 | 3/1998 |
| WO | WO-98/57381 | 12/1998 |
| WO | WO-99/48160 | 9/1999 |
| WO | WO-99/54385 | 10/1999 |
| WO | WO-00/48258 | 8/2000 |
| WO | WO-00/53656 A1 | 9/2000 |
| WO | WO-00/55927 A1 | 9/2000 |
| WO | WO-01/19142 | 3/2001 |
| WO | WO-01/62869 | 8/2001 |
| WO | WO-01/81649 | 11/2001 |
| WO | WO-02/31896 | 4/2002 |
| WO | WO-02/44189 | 6/2002 |
| WO | WO-02/45466 | 6/2002 |
| WO | WO-02/066552 | 8/2002 |
| WO | WO-02/068435 | 9/2002 |
| WO | WO-02/081448 | 10/2002 |
| WO | WO-02/084759 | 10/2002 |
| WO | WO-03/018653 | 3/2003 |
| WO | WO-03/022908 | 3/2003 |
| WO | WO-2004/021463 A2 | 3/2004 |
| WO | WO-2004/023573 | 3/2004 |
| WO | WO-2004/083277 | 9/2004 |
| WO | WO 2004/096945 | 11/2004 |
| WO | WO-2004/106409 | 12/2004 |
| WO | WO 2005/052027 | 6/2005 |
| WO | WO 2006/109083 | 10/2006 |

OTHER PUBLICATIONS

Bernius et al., "Progress with Light-Emitting Polymers," *Adv. Mat.*, 12(23):1737-1750 (2000).

Chen et al., "Recent Developments in Molecular Organic Electroluminescent Materials," *Macromol. Symp.*, 125:1-48 (1997).

Chen et al., "Triplet Exciton Confinement in Phosphorescent Polymer Light-Emitting Diodes," *Appl. Phys. Lett.*, 82(7):1006-1008 (2003).

Cleave et al., "Harvesting Singlet and Triplet Energy in Polymer LEDs," *Adv. Mat.*, 11(4):285-288 (1999).

Faber et al., "New Blue Crosslinkable Polymers for Organic Light Emitting Devices," *J. Macromol. Sci.—Pure Appl. Chem.*, A38(4):353-364 (2001).

Ikai et al., "Higly Efficient Phosphorescence from Organic Light-Emitting Devices with an Exciton-Block Layer," *Appl. Phys. Lett.*, 79(2):156-158 (2001).

Lane et al., "Origin of Electrophosphorescence from a Doped Polymer Light Emitting Diode," *Phys. Rev. B*, 63:235206-1-235206-8 (2001).

Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Marsitzky et al., "Poly-2,8-(indenofluorene-co-anthracene)—A Colorfast Blue-Light-Emitting Random Copolymer," *Adv. Mat.*, 13(14):1096-1099 (2001).

Muller et al., "Multi-colour Organic Light-Emitting Displays by Solution Processing," *Nature*, 421(20):829-832 (2003).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

O'Brien et al., "Electrophosphorescence from a Doped Polymer Light Emitting Diode," *Synth. Met.*, 116:379-383 (2001).

Setayesh et al., "Bridging the Gap Between Polyfluorene and Ladder-Poly-p-phenylene: Synthesis and Characterization of Poly-2,8-indenofluorene," *Macromolecules*, 33(6):2016-2020 (2000).

Yamaguchi et al., "Effects of B and C on the Ordering of $L1_0$-CoPt Thin Films," *Appl. Phys. Lett.*, 79(5):2001-2003 (2001).

Yamamoto, "Electrically Conducting and Thermally Stable π-Conjugated Poly(Arylene)s Prepared by Organometallic Processes," *Prog. Polym. Sci.*, 17:1153-1205 (1993).

Yang et al., "Efficient Blue Polymer Light-Emitting Diodes from a Series of Soluble Poly(Paraphenylene)s," *J. Appl. Phys.*, 79:934-939 (1996).

Zhu et al., "Synthesis of New Iridium Complexes and Their Electrophosphorescent Properties in Polymer Light-Emitting Diodes," *J. Mater. Chem.*, 13:50-55 (2003).

International Preliminary Report on Patentability for International Application No. PCT/GB2006/004745, dated Jun. 24, 2008.

International Search Report for International Application No. PCT/GB2006/004745, dated Mar. 5, 2007.

Written Opinion for International Application No. PCT/GB2006/004745 dated Mar. 5, 2007.

Office Action for corresponding European Patent Application No. 06 831 408.7-1235, dated Oct. 10, 2008.

Office Action for corresponding European Patent Application No. 06 831 408.7-1235, dated Feb. 23. 2010.

\* cited by examiner

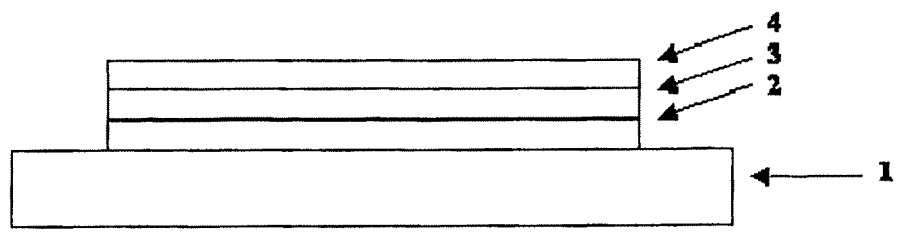

ELECTRONIC DEVICE

The present invention is concerned with an electronic device, particularly an organic light-emitting device and a method for making the same. The present invention also is concerned with hole transport materials for use in electronic devices and to methods for making the same.

Such electronic devices include organic light-emitting diodes (OLEDs). One or more of the layers in the device typically will comprise a polymer. Further, such devices typically comprise one or more semiconductive polymer layers located between electrodes. Semiconductive polymers are characterised by partial or substantial conjugation in the backbone and/or side chains.

Semiconductive polymers are now frequently used in a number of optical devices such as in polymeric light emitting devices ("PLEDs") as disclosed in WO 90/13148; field effect transistors ("FETs"); photovoltaic devices as disclosed in WO 96/16449; and photodetectors as disclosed in U.S. Pat. No. 5,523,555.

A typical LED comprises a substrate, on which is supported an anode, a cathode, and an organic light-emitting layer located between the anode and cathode and comprising at least one light-emitting material. In operation, holes are injected into the device through the anode and electrons are injected into the device through the cathode. The holes and electrons combine in the organic light-emitting layer to form an exciton, which then undergoes radiative decay to give light. Other layers may be present in the LED. For example a layer of a conducting organic hole injection material such as poly(ethylene dioxythiophene)/polystyrene sulfonate (PEDT/PSS) may be provided between the anode and the organic light-emitting layer to assist injection of holes from the anode to the organic light-emitting layer. Further, a layer of a semiconductive organic hole transport material may be provided between the anode (or the hole injection layer where present) and the organic light-emitting layer to assist transport of holes to the organic light-emitting layer.

Generally, it is desired that the polymer or polymers used in the afore-mentioned organic devices are soluble in common organic solvents to facilitate their deposition during device manufacture. Many such polymers are known. One of the key advantages of this solubility is that a polymer layer can be fabricated by solution processing, for example by spin-casting, ink-jet printing, screen-printing, dip-coating, roll printing etc. Examples of such polymers are disclosed in, for example, Adv. Mater. 2000 12(23) 1737-1750 and include polymers with at least partially conjugated backbones formed from aromatic or heteroaromatic units such as fluorenes, indenofluorenes, phenylenes, arylene vinylenes, thiophenes, azoles, quinoxalines, benzothiadiazoles, oxadiazoles, thiophenes, and triarylamines with solubilising groups, and polymers with non-conjugated backbones such as poly(vinyl carbazole). Polyarylenes such as polyfluorenes have good film forming properties and may be readily formed by Suzuki or Yamamoto polymerisation, which enables a high degree of control over the regioregularity of the resultant polymer.

In certain devices, it can be desirable to cast multiple layers, i.e., laminates, of different materials (typically polymers) on a single substrate surface. For example, this could be to achieve optimisation of separate functions, for example electron or hole charge transport, luminescence control, photon-confinement, exciton-confinement, photo-induced charge generation, and charge blocking or storage.

In this regard, it can be useful to be able to fabricate multilayers of materials (such as polymers) to control the electrical and optical properties, for example, across the device. This can be useful for optimum device performance. Optimum device performance can be achieved, for example, by careful design of the electron and hole transport level offset, of the optical refractive index mismatch, and of the energy gap mismatch across the interface. Such heterostructures can, for example, facilitate the injection of one carrier but block the extraction of the opposite carrier and/or prevent exciton diffusion to the quenching interface. Thereby, such heterostructures can provide useful carrier and photon confinement effects.

WO 2004/023573 is concerned with a method of forming an optical device comprising the steps of providing a substrate comprising a first electrode capable of injecting or accepting charge carriers of a first type; forming over the first electrode a first layer that is at least partially insoluble in a solvent by depositing a first semiconducting material that is free of cross-linkable vinyl or ethynyl groups and is, at the time of deposition, soluble in the solvent; forming a second layer in contact with the first layer and comprising a second semiconducting material by depositing a second semiconducting material from a solution in the solvent; and forming over the second layer a second electrode capable of injecting or accepting charge carriers of a second type wherein the first layer is rendered at least partially insoluble by one or more of heat, vacuum and ambient drying treatment following deposition of the first semiconducting material.

It is taught that the first semiconducting material is rendered at least partially insoluble by one or more of the aforementioned treatments when the first semiconducting material is a polymer having a fluorene repeat unit in the polymer backbone or is PVK. In the Examples, an "F8-TFB" hole transporting polymer (the first semiconducting material) is used. A layer of the hole transporting polymer is heated in an inert environment after deposition. It is demonstrated that the use of the heated "F8-TFB" layer improves the efficiency of the device. In addition to the effect of the presence of the fluorene repeat unit in "F8-TFB", it is taught on page 13 that the improved efficiency applies in particular when the polymer comprises basic units such as amines of formulae 1 to 6 given in WO 2004/023573 or Het groups within the scope of formula 7 given in WO 2004/023573, that are capable of accepting protons.

EP 1310539 is concerned with light-emitting devices. More specifically this disclosure is concerned with light-emitting materials for use in such devices; namely polymer compounds comprising a repeating unit represented by formula (a) and a repeating unit represented by formula (b):

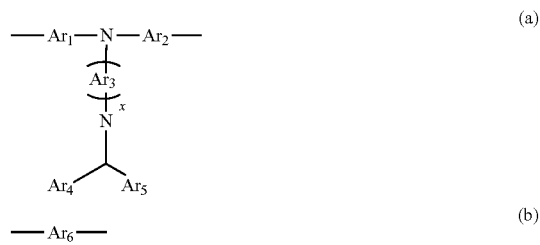

wherein $Ar_1$, $Ar_2$, and $Ar_6$ each independently represent an arylene group, a divalent heterocyclic compound group, etc.; $Ar_3$ is an arylene group, an arylene vinylene group, or a divalent heterocyclic compound group; $Ar_4$ and $Ar_5$ are each independently an aryl group or a monovalent heterocyclic compound group.

Hole transporting layers are mentioned in, for example, paragraphs [0111] and [0117] of EP 1310539. Examples of known hole transporting materials are given in paragraphs [0132] to [0137] of EP 1310539.

In view of the above it will be understood that there remains a need to provide further hole transporting materials for use in organic (typically polymer) electronic devices, preferably materials that increase the efficiency of the device.

As such, it is an aim of the present invention to provide a new organic electronic device characterised by its hole transporting layer, preferably having improved efficiency. Further it is an aim of the present invention to provide a method for fabricating the new device. Still further it is an aim of the present invention to provide novel hole transporting materials and a method for making the same.

The present inventors have unexpectedly discovered that a semiconductive polymer comprising a first repeat unit comprising a first nitrogen of a triarylamine in the polymer backbone and a second nitrogen of an arylamine pendant from the polymer backbone advantageously may be used as a hole transporting material in an electronic device, particularly an organic light-emitting device (LED).

Therefore, a first aspect of the present invention provides an electronic device containing a hole transporting semiconductive polymer comprising a first repeat unit comprising a first nitrogen of a triarylamine in the polymer backbone and a second nitrogen of an arylamine pendant from the polymer backbone, characterised in that said semiconductive polymer performs the function of transporting holes to or from a semiconductive material in said device.

The arylamine is preferably a triarylamine.

Preferably, the electronic device comprises an organic light-emitting device wherein the hole transporting semiconductive polymer performs the function of transporting holes to a light-emitting semiconductive material in an emissive layer of said organic light-emitting device.

The hole transporting semiconductive polymer may be contained in said emissive layer. Alternatively, the hole transporting semiconductive polymer may be comprised in a hole transport layer of the device.

The present inventors have found that semiconductive polymers comprising a first repeat unit comprising the first nitrogen in the polymer backbone and the second nitrogen pendent from the polymer backbone have good hole transporting properties and, additionally, unexpectedly improve device performance by increasing the lifetime of emission from an organic light-emitting device. This has been observed particularly as compared with polymers comprising TFB or PFB repeat units. According to the present invention, lifetime measurements are obtained at room temperature (295° K) by measuring the time taken for luminescence to decrease by half at a constant current.

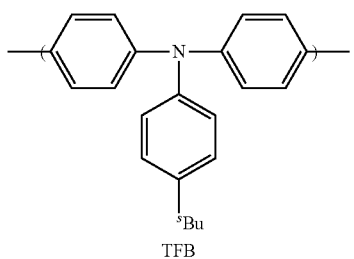

TFB

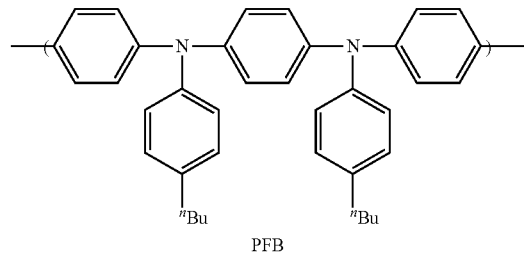

PFB

It will be understood that the term "triarylamine" as used herein means an amine having a central nitrogen atom with three groups, each independently selected from aryl and heteroaryl groups, attached thereto.

It will be understood that the term "arylamine" as used herein means an amine having a central nitrogen atom with at least one aryl or heteroaryl group attached thereto.

Preferably, the triarylamine containing the first nitrogen is in conjugation with the arylamine containing the second nitrogen.

The triarylamine containing the first nitrogen may comprise a part of the arylamine containing the second nitrogen. In particular, the triarylamine containing the first nitrogen may comprise the at least one aryl or heteroaryl group of the arylamine containing the second nitrogen.

The first repeat unit may comprise a general formula 1:

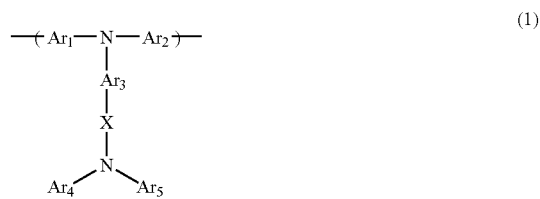

(1)

where $Ar_1$, $Ar_2$, $Ar_3$, $Ar_4$ and $Ar_5$ each independently represent an aryl or heteroaryl ring or a fused derivative thereof; and X represents an optional spacer group.

Preferred fused derivatives of aryl and heteroaryl rings include fused carbocyclic aromatics, for example naphthalene, anthracene and fluorene; and fused heterocyclic aromatics, for example benzothiadiazole.

Preferably, at least one of $Ar_1$, $Ar_2$, $Ar_3$, $Ar_4$ and $Ar_5$ represents a fused derivative of an aryl or heteroaryl ring. More preferably, $Ar_3$ represents a fused derivative of an aryl or heteroaryl ring.

The aryl or heteroaryl rings or fused derivatives thereof may be unsubstituted or substituted.

In formula 1, in addition to those linkages shown, $Ar_1$ may be linked to $Ar_2$ by a direct bond or a bridging group or bridging atom. Creating a link between $Ar_1$ and $Ar_2$ will control the planarity along the backbone of the polymer, which will enable hole injecting properties of the polymer to be tuned.

The first repeat unit may comprise general formula 2 or 3:

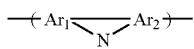
(2)

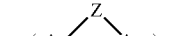
(3)

where $Ar_1$ to $Ar_5$ and X are as defined anywhere herein and Z represents a bridging group or bridging atom.

$Ar_1$ may be linked to $Ar_3$ by a direct bond or a bridging group or bridging atom. $Ar_2$ may be linked to $Ar_3$ by a direct bond or a bridging group or a bridging atom. $Ar_1$ and $Ar_2$ may be linked to $Ar_3$.

The first repeat unit may comprise general formula 4:

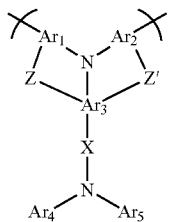
(4)

where $Ar_1$ to $Ar_5$ and X are as defined anywhere herein; and Z and Z' each independently represent a bridging group or bridging atom.

When X is present, $Ar_4$ may be linked to X by a direct bond or a bridging group or bridging atom. Similarly, $Ar_5$ may be linked to X by a direct bond or a bridging group or bridging atom. $Ar_4$ and $Ar_5$ may be linked to X. When X is not present, $Ar_4$ may be linked to $Ar_3$ by a direct bond or a bridging group or bridging atom. Similarly, $Ar_5$ may be linked to $Ar_3$ by a direct bond or a bridging group or bridging atom. $Ar_4$ and $Ar_5$ may be linked to $Ar_3$.

The first repeat unit may comprise general formula 5 or 6:

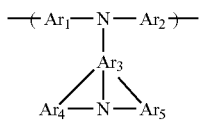
(5)

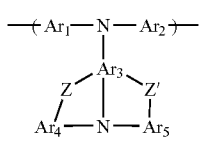
(6)

where $Ar_1$ to $Ar_5$ are as defined anywhere herein; and Z and Z' each independently represent a bridging group or bridging atom.

In the case where Z and/or Z' are bridging atoms they are preferably selected from the group consisting of C, N, O and S. C and N bridging atoms may be unsubstituted (i.e. —$CH_2$— and —NH— respectively) or substituted. Alkyl is a preferred substituent. Z is preferably a heteroatom.

$Ar_4$ may be linked to $Ar_5$ by a direct bond or a bridging group or bridging atom.

The first repeat unit may comprise general formula 7 or 8:

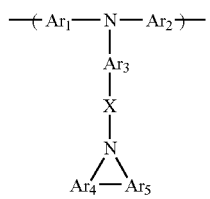
(7)

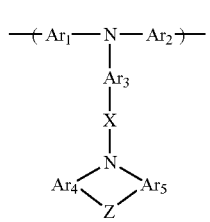
(8)

where $Ar_1$ to $Ar_5$ and X are as defined anywhere herein; and Z represents a bridging group or bridging atom.

When two of the aryl or heteroaryl rings or fused derivatives thereof are linked in the first repeat unit, the skilled person will know whether it is desirable for the link to be a direct bond or a bridging group or bridging atom. This will depend on the tension which would be caused in the first repeat unit with these respective options. Preferably, the link forms a new five or six membered ring incorporating the first nitrogen or the second nitrogen. More preferably, the link forms a new five membered ring that is comprised in a carbazole unit.

Suitable bridging groups include alkyl groups such as a $CH_2$ group or a chain of $CH_2$ groups. Suitable bridging atoms include oxygen, sulfur, nitrogen, phosphorus and silicon, preferably oxygen.

In one embodiment, only $Ar_1$ and $Ar_2$ are linked. In another embodiment, only $Ar_4$ and $Ar_5$ are linked. In another embodiment, $Ar_1$ and $Ar_2$ are linked and $Ar_4$ and $Ar_5$ are linked. In another embodiment, $Ar_3$ and $Ar_4$ are linked and $Ar_3$ and $Ar_5$ are linked. In another embodiment, $Ar_1$ and $Ar_3$ are linked and $Ar_2$ and $Ar_3$ are linked.

$Ar_1$ and $Ar_2$ may be selected to tune the electronic properties of the semiconductive polymer. $Ar_1$ and $Ar_2$ independently represent any suitable aryl or heteroaryl ring or a fused derivative thereof. Preferably, one or both of $Ar_1$ and $Ar_2$ represents an electron rich aryl or heteroaryl ring or a fused derivative thereof. Electron rich aryl or heteroaryl rings include optionally fused phenyl, 2,5-linked thiophene, furan and pyrrole.

Preferably, one or both of $Ar_1$ and $Ar_2$ represents a 5 to 14 membered ring more preferably a six membered ring. $Ar_1$ may represent phenyl, preferably 1,3 phenyl or 1,4 phenyl. $Ar_2$ may represent phenyl, preferably 1,3 phenyl or 1,4 phenyl. It is preferred that both $Ar_1$ and $Ar_2$ represent phenyl. Another preferred $Ar_1$ or $Ar_2$ is optionally substituted pyrimidine.

The first repeat unit may comprise general formula 9 or 10:

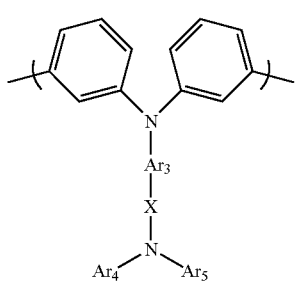
(9)

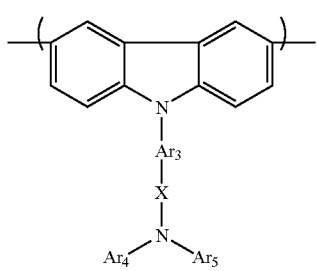
(10)

where $Ar_3$ to $Ar_5$ and X are as defined anywhere herein.

Preferably one or both of $Ar_1$ and $Ar_2$ is/are unsubstituted.

$Ar_4$ and $Ar_5$ each independently may represent any suitable aryl or heteroaryl ring or a fused derivative thereof. Preferably, one or both of $Ar_4$ and $Ar_5$ represents an electron rich aryl or heteroaryl ring or a fused derivative thereof. Electron rich aryl or heteroaryl rings include optionally fused phenyl; 2-thienyl, 2-furyl and N-pyrrole or 2-pyrrole.

Preferably, one or both of $Ar_4$ and $Ar_5$ represents a 5 to 14 membered ring, more preferably a six membered ring. $Ar_4$ may represent phenyl. $Ar_5$ may represent phenyl. Preferably, $Ar_4$ and $Ar_5$ both represent phenyl.

Preferably one or both of $Ar_4$ and $Ar_5$ represents a substituted aryl or heteroaryl ring or a fused derivative thereof, more preferably a substituted phenyl ring. When $Ar_4$ and/or $Ar_5$ represents a substituted phenyl ring, $Ar_4$ and/or $Ar_5$ may have up to five substituents. One substituent located at the para position is preferred. Suitable substituents may be selected from the group consisting of alkyl, alkoxy, aryl, arylalkyl, heteroaryl, and heteroaryl alkyl. C1 to C20 alkyl or alkoxy substituents are preferred, and C4 to C8 are most preferred. Suitable substituents further include polyethylene glycol groups, thioalkyl groups and cycloalkyl groups.

The first repeat unit may comprise general formula 11 or 11a:

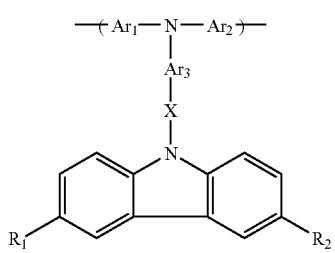
(11)

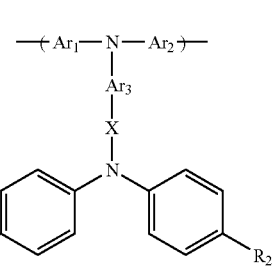
(11a)

where $Ar_1$ to $Ar_3$ and X are as define anywhere herein; and $R_1$ and $R_2$ each independently represent any suitable substituents as described herein.

The first repeat unit may comprise general formula 12, 13, 14 or 15:

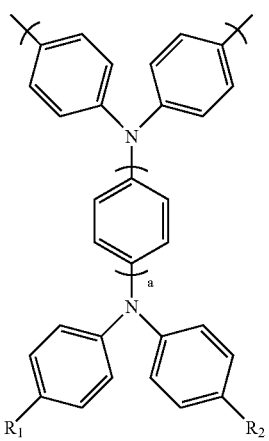
(12)

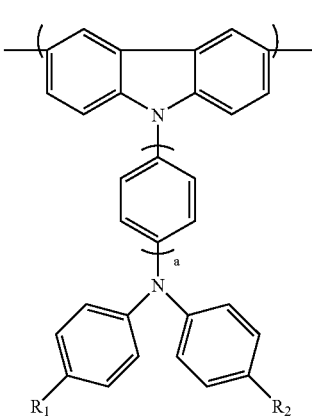
(13)

-continued

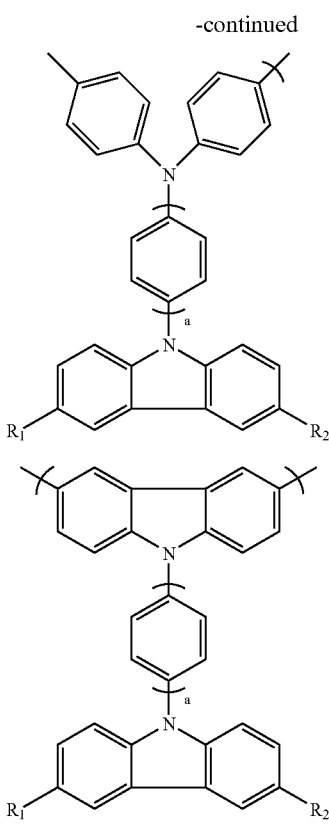

(14)

(15)

where a=1 to 3 and $R_1$ and $R_2$ each independently represent any suitable substituents as described herein.

The first repeat unit may comprise general formula 16:

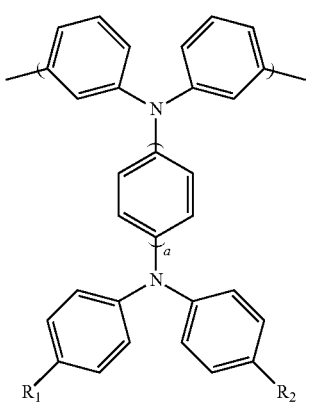

(16)

where a=1 to 3 and where $R_1$ and $R_2$ independently represent any suitable substituents as described herein.

$R_1$ and $R_2$ may be the same or different. Preferably, $R_1$ and $R_2$ are the same. Preferably $R_1$ and $R_2$ both represent C1 to C20 alkyl, more preferably C4 to C8 alkyl.

$Ar_4$ may be linked to a further aryl or heteroaryl ring or a fused derivative thereof ($Ar_7$). $Ar_7$ preferably represents an electron rich aryl or heteroaryl ring or a fused derivative thereof, for example as described anywhere herein. $Ar_7$ preferably represents a 5 to 14 membered ring, more preferably a six membered ring. $Ar_7$ may represent phenyl. $Ar_7$ may be substituted. $Ar_7$ may represent a mono, para-substituted phenyl. Suitable substituents may be selected from the group consisting of alkyl, alkoxy, aryl, arylalkyl, heteroaryl, and heteroaryl alkyl. C1 to C20 alkyl or alkoxy substituents are preferred, and C4 to C8 are most preferred. Suitable substituents further include polyethylene glycol groups, thioalkyl and cycloalkyl groups.

$Ar_5$ may be linked to a further aryl or heteroaryl ring or a fused derivative thereof ($Ar_8$). $Ar_8$ preferably represents an electron rich aryl or heteroaryl ring or a fused derivative thereof, for example as described anywhere herein. $Ar_8$ preferably represents a 5 to 14 membered ring, more preferably a six membered ring. $Ar_8$ may represent phenyl. $Ar_8$ may be substituted. $Ar_8$ may represent a mono, para-substituted phenyl. Suitable substituents may be selected from the group consisting of alkyl, alkoxy, aryl, arylalkyl, heteroaryl, and heteroaryl alkyl. C1 to C20 alkyl or alkoxy substituents are preferred, and C4 to C8 are most preferred. Suitable substituents further include polyethylene glycol groups, thioalkyl and cycloalkyl groups.

The first repeat unit may comprise general formula 17:

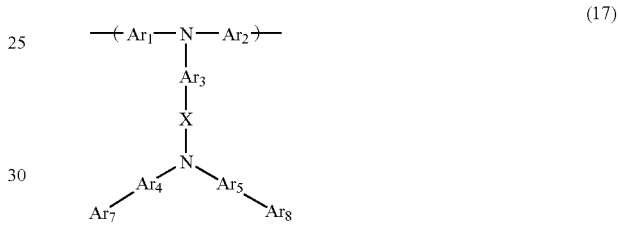

(17)

where $Ar_1$ to $Ar_8$ and X are as defined anywhere herein.

$Ar_3$ may represent any suitable aryl or heteroaryl ring or a fused derivative thereof, preferably, an electron rich aryl or heteroaryl ring or a fused derivative thereof. Electron rich aryl or heteroaryl rings include phenyl, which optionally may be fused such as in naphthylene or anthracene; and 2,5-linked thiophene, furan or pyrrole. $Ar_3$ preferably represents a 5 to 14 membered ring, more preferably a six membered ring. $Ar_3$ may represent phenyl or a fused derivative thereof, for example 1,4- or 2,6-naphthylene or 9,10-anthracene. $Ar_3$ is preferably comprises a planar aryl or heteroaryl ring or fused derivative thereof.

The first repeat unit may comprise general formula 18 or 19:

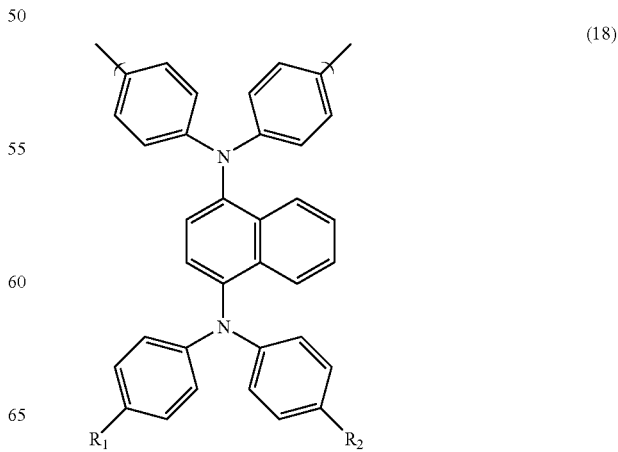

(18)

-continued

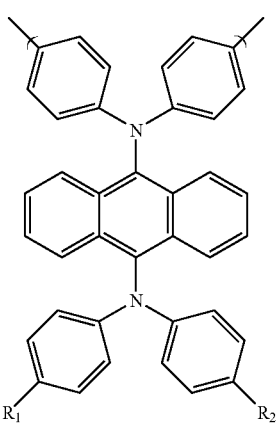
(19)

where $R_1$ and $R_2$ are as defined anywhere herein.

When present, X may represent any suitable spacer group.

The triarylamine containing the first nitrogen may be in conjugation with the arylamine containing the second nitrogen. In this case, X may be a conjugated spacer group.

X may represent an aryl or heteroaryl ring or a fused derivative thereof ($Ar_6$). Thus, the first repeat unit may comprise general formula 20:

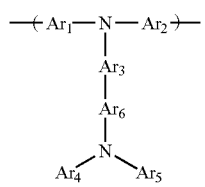
(20)

where $Ar_1$ to $Ar_6$ are as defined anywhere herein. $Ar_6$ preferably represents an electron rich aryl or heteroaryl ring or a fused derivative thereof, for example as described anywhere herein. $Ar_6$ preferably represents a 5 to 14 membered ring, more preferably a six membered ring. $Ar_6$ may be substituted.

X may represent phenyl. X may have a second link to Ar3 by a direct bond or via a bridging group or bridging atom. For example, when Ar3 represents phenyl and X represents phenyl, Ar3 and X may have a second link that is via a carbon bridging atom, thus forming a fluorene group. The fluorene group may comprise formula 21 as shown below:

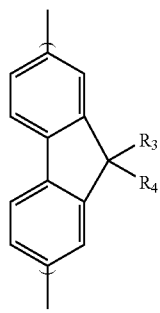
(21)

where $R_3$ and $R_4$ each independently represent H or a substituent group such as alkyl, alkoxy, aryl, arylalkyl, heteroaryl or heteroarylalkyl. Preferably, at least one of $R_3$ and $R_4$ comprises an optionally substituted C4 to C20 alkyl (more preferably C4 to C8 alkyl) or aryl group.

The first repeat unit may comprise general formula 22:

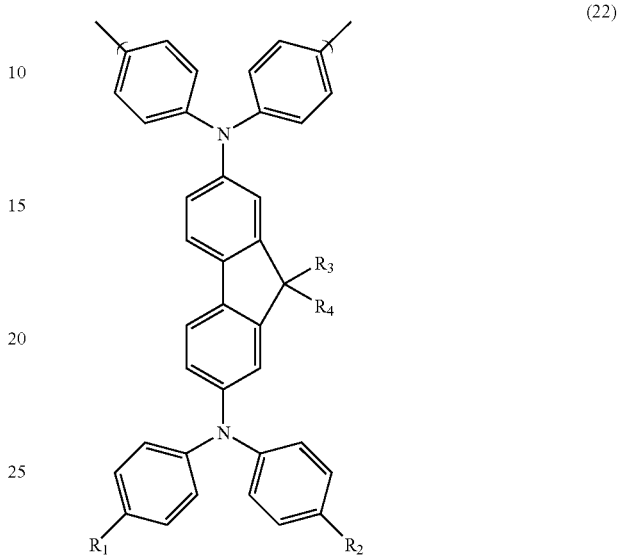
(22)

where $R_1$, $R_2$, $R_3$ and $R_4$ are as defined anywhere herein.

X may represent a group having formula —Ar6-Y— so that the first repeat unit comprises a group having general formula 23:

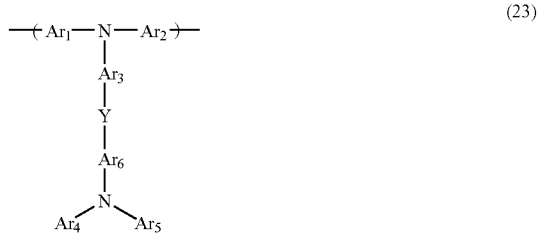
(23)

where $Ar_1$ to $Ar_5$ are as defined anywhere herein; $Ar_6$ represents an aryl or heteroaryl ring or a fused derivative thereof and Y represents an electron donating group, such as oxygen or sulphur.

Examples of first repeat unit s according to the present invention include repeat units comprising general formulae 24 to 27:

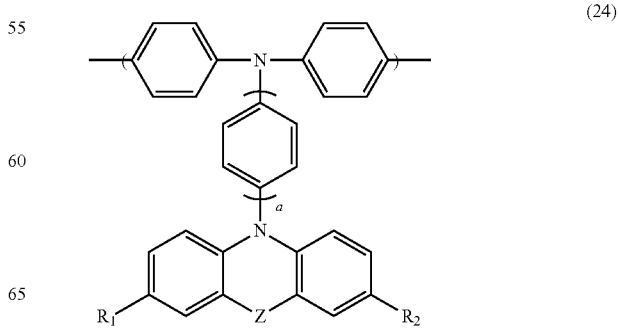
(24)

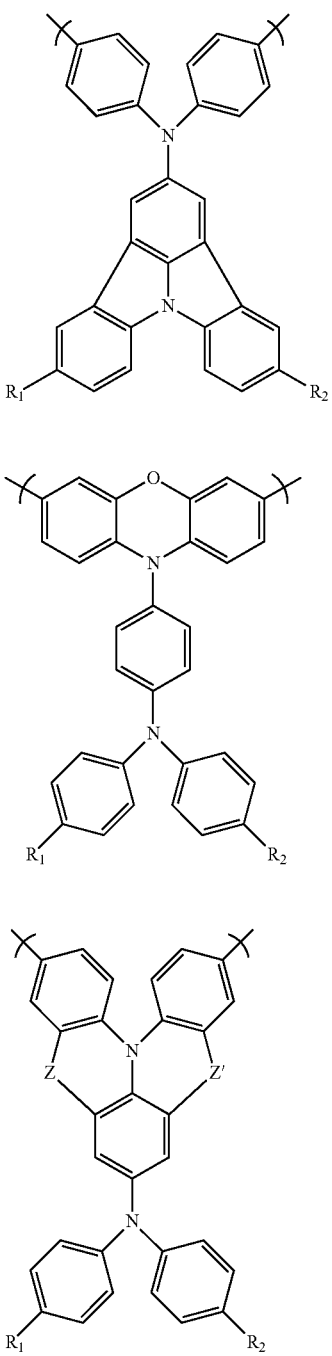

where $R_1$ and $R_2$; Z and Z' are as defined anywhere herein.

In one embodiment, the first repeat unit further contains a further arylamine containing a third nitrogen. The third nitrogen may be in the polymer backbone or pendent from the polymer backbone. Preferably, the arylamine containing the third nitrogen is a triarylamine.

The third nitrogen may be linked directly or indirectly to Ar4 or Ar5.

The third nitrogen may be linked directly or indirectly to Ar3 or X. The first repeat unit may comprise general formula 28:

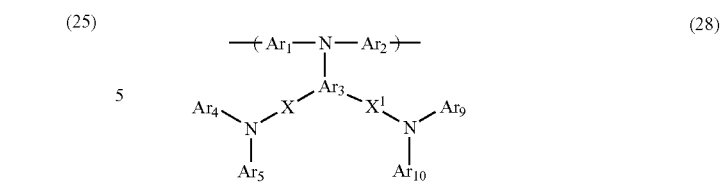

where $Ar_1$, $Ar_2$, $Ar_3$, $Ar_4$, $Ar_5$ and X are as defined anywhere herein; $X^1$ represents an optional spacer group as defined anywhere herein; and $Ar_9$ and $Ar_{10}$ each independently represent an aryl or heteroaryl ring or a fused derivative thereof, preferably an electron rich aryl or heteroaryl ring or a fused derivative thereof as defined anywhere herein. $Ar_9$ and/or $Ar_{10}$ may be linked together, to $X^1$, or to $Ar_3$ in a manner analogous to the linkage of $Ar_4$, $Ar_5$, X and $Ar_3$, respectively, described herein.

The first repeat unit may comprise general formula 29:

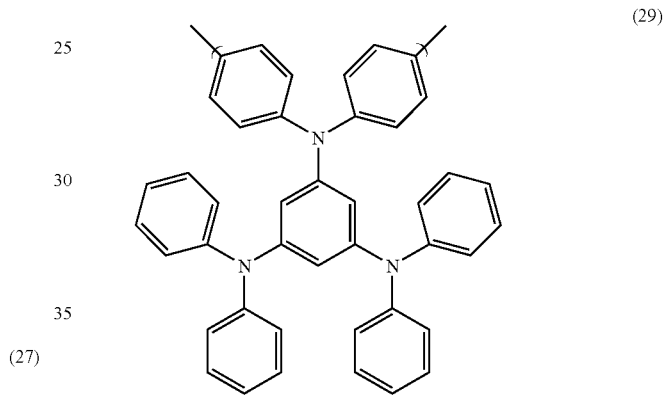

Preferably, general formula 29 is substituted, more preferably, it is substituted with from 1 to 5 substituents, most preferably at least 4 substituents. Any, substituent preferably is located at a position para to one of the nitrogens. Preferred substituents are as described herein for R1 and R2.

The first repeat unit may further contain a further arylamine containing a fourth nitrogen. The arylamine containing the fourth nitrogen preferably is a triarylamine. The third and fourth nitrogens may be linked directly or indirectly to Ar4 and Ar5, respectively. The first repeat unit may comprise general formula 30:

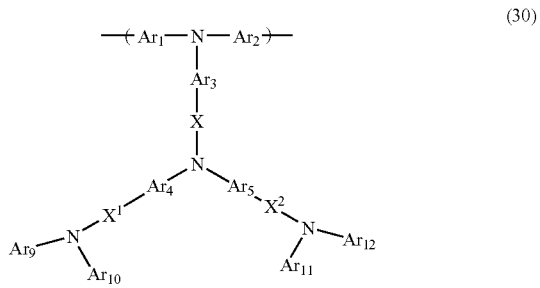

where $Ar_1$ to $Ar_5$, $Ar_9$, $Ar_{10}$, X and $X^1$ are as defined anywhere herein; $X^2$ represents an optional spacer group as defined anywhere herein; and $Ar_{11}$ and $Ar_{12}$ each independently represent an aryl or heteroaryl ring or a fused derivative thereof, preferably an electron rich aryl or heteroaryl ring or a fused derivative thereof as defined anywhere herein. $Ar_{11}$ and/or $Ar_{12}$ may be linked together, to $X^2$, or to $Ar_5$ in a manner analogous to the linkage of $Ar_4$, $Ar_5$, X and $Ar_3$, respectively, described herein.

The first repeat unit may comprise general formula 31:

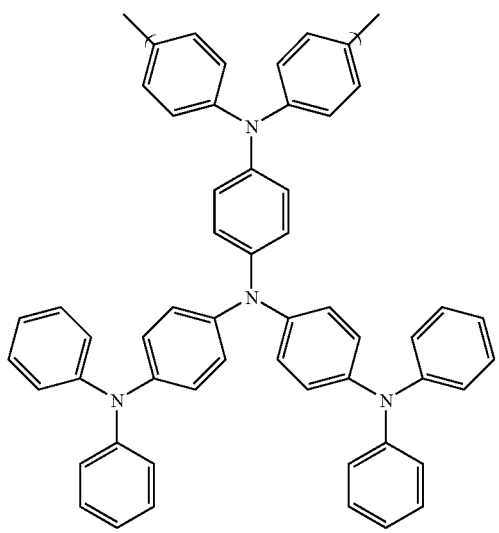

(31)

Preferably general formula 31 is substituted, more preferably it is substituted with from 1 to 5 substituents, most preferably at least 4 substituents. Any substituent preferably is located at a position para to one of the nitrogens. Preferred substituents are as described herein for R1 and R2.

When the third nitrogen is in the polymer backbone, the fourth nitrogen may be pendent from the arylamine containing the third nitrogen and therefore the arylamine containing the fourth nitrogen may be pendent from the polymer backbone. The first repeat unit may comprise general formula 32:

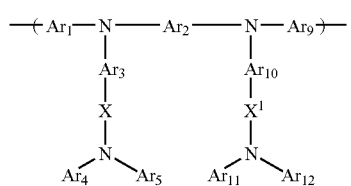

(32)

where $Ar_1$ to $Ar_5$, $Ar_9$ to $Ar_{12}$, X and $X^1$ are defined in relation to general formula 30. The first repeat unit may comprise general formula 33 or 33a:

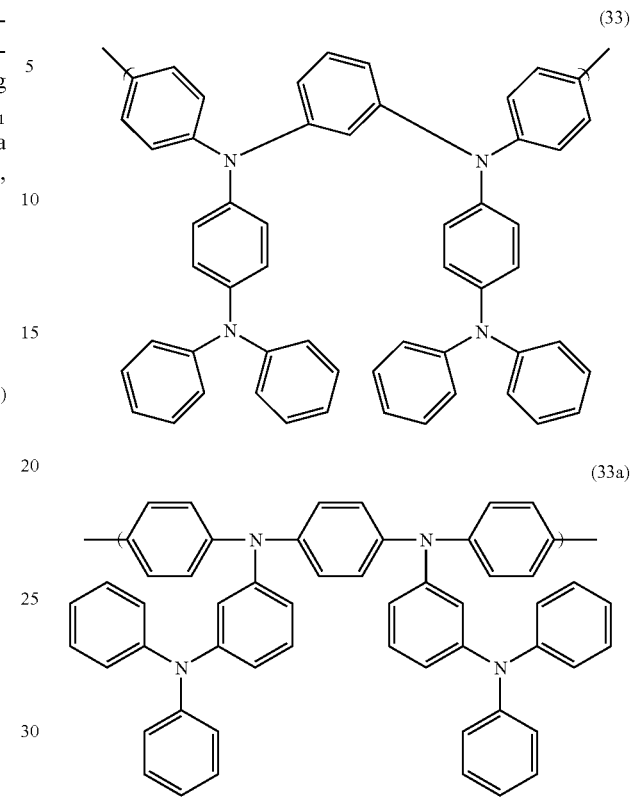

(33)

(33a)

Preferably, general formula 33 and 33a are substituted, more preferably they are each substituted with from 1 to 5 substituents, most preferably at least 4 substituents. Any substituent preferably is located at a position para to one of the nitrogens. Preferred substituents are as described herein for $R_1$ and $R_2$.

In formulae 9, 10, 12 to 16, 18, 19, 22, 24 to 27, 31, 33 and 33a, the 1,4 phenyl rings in the polymer backbone may be replaced with 1,3 phenyl rings and vice versa.

When $Ar_3$ represents phenyl, this may be 1,3 (meta) or 1,4 (para) linked. In one preferred embodiment $Ar_3$ is metalinked phenyl and $Ar_1$, $Ar_2$ (and $Ar_9$ when present) each is para linked phenyl.

The aryl groups in the backbone of the first repeat units illustrated above are para-linked in order to maximise conjugation, however any of backbone aryl groups of these units may be meta- or para-linked in order to disrupt conjugation and thereby increase the bandgap of the polymer comprising the first repeat unit.

Preferably the semiconductive polymer is soluble in common organic solvents, such as alkylated benzenes, in particular xylene, and toluene.

The semiconductive polymer preferably is partially or fully conjugated along the polymer backbone.

Preferably, the semiconductive polymer comprises a copolymer or higher order polymer (e.g. terpolymer). The polymer may contain from 0.1-100 mol %, more preferably 5% to 70% mol %, more preferably 15% to 30 mol % of a first repeat unit, as described anywhere above. The optimal ratio of first repeat unit is dependant on the number of (tri)arylamine units in the repeat unit; the greater the number of (tri)arylamine units present, the lower the optimal ratio.

The polymer may contain any suitable co-repeat units. Preferable co-repeat units are those comprising an aryl or heteroaryl group (including fused aromatics), in particular fully conjugated co-repeat units such as phenylene or fluorene repeat units. Preferably, the aryl or heteroaryl group is in the polymer backbone. Preferably, the polymer contains a co-repeat unit comprising a 2,7-linked fluorene group. Preferably, the fluorene group is disubstituted at the 9 position. Preferably, the co-repeat unit comprises a 9,9 dialkyl fluorene.

A preferred copolymer consists of a first repeat unit and a fluorene repeat unit. Preferred ratios of repeat units are as discussed above.

It may be desirable for the polymer to contain two different fluorene-containing co-repeat units. It may be desirable for the copolymer to contain a co-repeat unit comprising an amine group.

Preferred aryl and heteroaryl groups to be present in the co-repeat units are those comprising a group selected from fluorene (particularly 2,7-linked fluorene, more particularly 2,7 linked 9,9 dialkyl or diaryl fluorene); spirofluorene (particularly 2,7-linked 9,9 spirofluorene); indenofluorene (particularly 2,7-linked indenofluorene); phenylene (particularly p-linked substituted phenylene such as p-linked alkyl or alkoxy substituted phenylene); arylenevinylene (such as phenylenevinylene); thiophene (particularly, 2,5-linked substituted or unsubstituted thiophene); benzothiadiazole (particularly 2,5-linked benzothiadiazole, more particularly 2,5-linked substituted benzothiadiazole such as 2,5-linked disubstituted benzothiadiazole); triarylamine; or carbazole. Such co-repeat units can be used to further tune the electronic and processing properties of the polymer.

1,4-phenylene repeat units are disclosed in, for example, J. Appl. Phys. 1996, 79, 934; fluorene repeat units are disclosed in, for example, EP 0842208; indenofluorene repeat units are disclosed in, for example, Macromolecules 2000, 33(6), 2016-2020; and spirofluorene repeat units are disclosed in, for example EP 0707020.

The aryl or heteroaryl group(s) present in any co-repeat unit may be substituted. Examples of substituents include solubilising groups; electron withdrawing such as fluorene, nitro or cyano; and substituents for increasing the glass transition temperature (Tg) of the polymer. Suitable solubilising groups include C1 to C20 alkyl or alkoxy groups. Branched C4 to C20 alkyl or alkoxy groups are preferred. Branched C4 to C20 alkyl groups are more preferred. Branched C4 to C20 alkyl or alkoxy groups comprising a tertiary carbon atom are more preferred.

The semiconductive polymer may comprise an AB copolymer.

The semiconductive polymer may be crosslinked. In this case, the semiconductive polymer contains a repeat unit containing a crosslinking group. The crosslinking group may be present on the first repeat unit or, where present, a co-repeat unit of the semiconductive polymer. The crosslinking group is preferably present on a co-repeat unit. A particularly preferred repeat unit in this regard is a repeat unit of formula (41) below wherein at least one of $R^5$ and $R^6$ comprises a crosslinking group. Crosslinking repeat units and groups are disclosed in, for example, WO 96/20253, WO 2005/052027, J. Macro. Mol. Sci.—Pure Appl. Chem., A38(4), 353-364 (2001) and Nature, Volume 421, 2003 pages 829-832.

Typically the crosslinked polymer will be formed from the equivalent polymer containing crosslinkable groups capable of forming the crosslinking groups by a crosslinking reaction. The crosslinking reaction may be initiated by heat, UV or a chemical initiator. Suitable crosslinkable groups capable of forming crosslinking groups in the crosslinked polymer include unsaturated groups such as vinyl, (meth)acrylate groups and azides and cyclic groups, such as oxetanes and cyclobutanes, in particular benzocyclobutane. The crosslinking group may be bound directly to the first repeat unit or co-repeat unit or may be spaced from the first- or co-repeat unit by a spacer group. The spacer group may be saturated (for example $C_{1-10}$ alkyl) or may be unsaturated (for example phenyl).

Preferably, the crosslinking groups/crosslinkable groups are not comprised in the polymer backbone.

Preferably, the crosslinkable groups are terminal groups.

When the crosslinking groups/croslinkable groups are present on the first repeat unit, they preferably are located so that each occupies a position para to one of the nitrogens, for example:

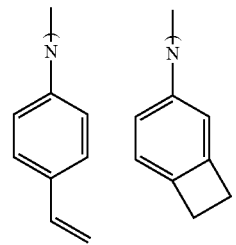

In one embodiment, the semiconductive polymer comprising the first repeat unit as described herein is comprised in a hole transport layer of the electronic device. Preferably, the thickness of the hole transport layer is less than 40 nm, more preferably 10 to 30 nm.

The device may comprise a photovoltaic device.

The device preferably comprises an organic light-emitting device (LED), more preferably comprising an anode, a cathode, and an organic light-emitting layer located between the anode and cathode and comprising at least one light-emitting material.

In one embodiment of an LED, the semiconductive polymer comprising the first repeat unit as described herein is comprised in a hole transport layer situated between the anode and the light-emitting layer. In another embodiment, the semiconductive polymer is comprised in a light-emitting layer.

When the semiconductive polymer is comprised in a light-emitting layer it may perform the function of hole transport and/or emission. The semiconductive polymer may emit blue light. By "blue light" is meant light having a wavelength in the range of 400-500 nm, more preferably 430-500 nm.

An important parameter is the lifetime of a device. Inadequate device lifetimes for LEDs are a particular problem for blue light-emitting polymers. In this regard, device lifetime has been found to be especially improved for a blue light-emitting device when the device contains a hole transport semiconductive polymer comprising a first repeat unit as described herein. Therefore, preferably, the LED emits blue light.

Preferably, the LED is comprised in a pulse-driven display. Unexpectedly, the use of the semiconductive polymer according to the first aspect of the invention in a hole transport layer has been found to improve lifetime of pulse-driven displays as compared to other hole transport layers.

In another embodiment, the LED is comprised in a d-c-driven display.

A second aspect of the present invention provides the use of a semiconductive polymer comprising a first repeat unit comprising a first nitrogen of a triarylamine in the polymer backbone and a second nitrogen of an arylamine pendent from the polymer backbone, as described anywhere in relation to the first aspect of the present invention, for transporting holes to or from a semiconductive material in an electronic device, preferably to a light-emitting material. Preferably, the device is a full colour device (i.e. comprising red, green and blue light-emitting materials), and the semiconductive polymer according to the second aspect of the invention transports holes to at least two of the red, green and blue materials, and preferably all three. Use of a common material for transporting holes to different colour emitters simplifies device manufacture. The device may be as discussed anywhere herein.

A third aspect of the present invention provides a method of manufacturing an electronic device, preferably an organic light-emitting device, as described anywhere herein.

In the method according to the third aspect, the semiconductive polymer comprising the first repeat unit preferably is deposited by solution processing.

When the semiconductive polymer comprising the first repeat unit is comprised in a hole transport layer of the device, the method may include a step of crosslinking the semiconductive polymer prior to depositing the next layer of the device thereon. Alternatively, the method may include a step of treating the layer with heat, vacuum or ambient drying to render the layer at least partially insoluble prior to depositing the next layer of the device thereon, as described for example in WO 2004/023573.

A fourth aspect of the present invention provides novel hole transport semiconductive polymers as described in relation to the first aspect of the present invention. In particular, the fourth aspect provides a semiconductive polymer comprising a first repeat unit comprising general formula 1 as described anywhere in relation to the first aspect of the present invention, provided that at least one of $Ar_1$, $Ar_2$, $Ar_3$, $Ar_4$ and $Ar_5$ represents a fused derivative of an aryl or heteroaryl ring. Preferably, the at least one fused derivative of an aryl or heteroaryl ring is selected from the group consisting of fused carbocyclic aromatics, for example naphthalene, anthracene and fluorene; and fused heterocyclic aromatics, for example benzothiadiazole.

A fifth aspect of the present invention provides novel monomers comprising at least one reactive leaving group L suitable for participating in polymerisation; and a structural unit comprising the first repeat unit as described in relation to the first aspect of the present invention, such that, when polymerised, the first nitrogen is incorporated into the polymer backbone and the second nitrogen is pendent from the polymer backbone.

The monomer may contain two reactive leaving groups L and L' suitable for participating in polymerisation. The monomer may comprise the first repeat unit described anywhere in relation to the first aspect of the present invention with reactive leaving groups L and $L^1$ added to the terminals of the first repeat unit. This is exemplified below:

L-first repeat unit -$L^1$ (34)

A sixth aspect of the present invention provides a method for making a semiconductive polymer as defined in relation to the fourth aspect using a plurality of monomers defined in relation to the fifth aspect.

The present invention now will be described in further detail with reference to the attached figures in which:

FIG. 1 represents an LED.
FIG. 2 shows a passive matrix device.
FIG. 3 shows an active matrix device.

The semiconductive polymer may additionally provide the functions of electron transport and/or emission depending on which layer of the device it is used in and the nature of co-repeat units.

The semiconductive polymer may contain a co-repeat unit selected from repeat units of formulae 35 to 40:

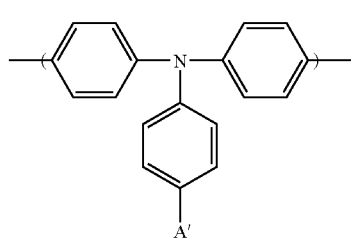

35

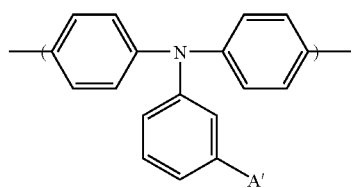

36

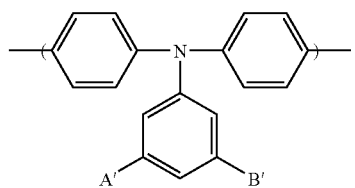

37

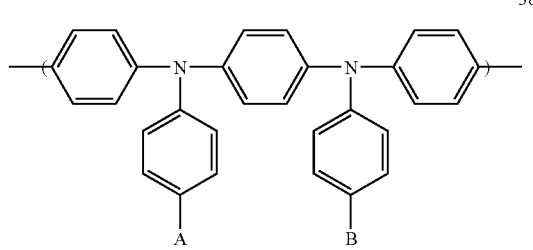

38

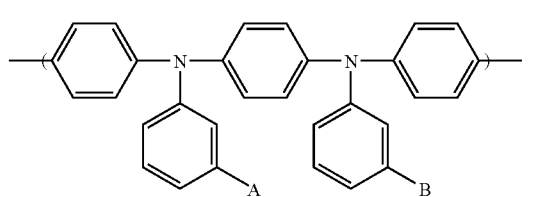

39

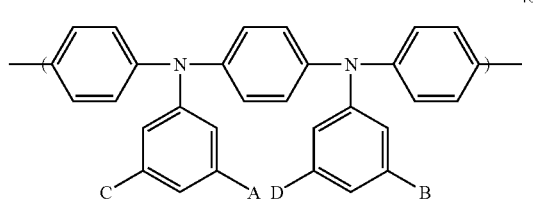

40 wherein A', B', A, B, C and D are independently selected from H or a substituent group. More preferably, one or more of A', B', A, B, C and D is independently selected from the group consisting of alkyl, aryl, perfluoroalkyl, thioalkyl, cyano, alkoxy, heteroaryl, alkylaryl and arylalkyl groups. Most preferably, A', B', A and B are $C_{1-10}$ alkyl.

One or more of the phenyl groups in repeat units 35 to 40 may optionally be linked.

The semiconductive polymer may contain optionally substituted carbocyclic aromatic repeat units, for example fluorene repeat units; spirobifluorene repeat units as disclosed in, for example EP 0707020; and indenofluorene repeat units as disclosed in, for example, Adv. Mater. (2001), 13(14), 1096-1099). A preferred fluorene repeat unit comprises formula 41:

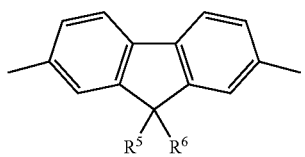

(41)

wherein $R^5$ and $R^6$ are independently selected from hydrogen or optionally substituted alkyl, alkoxy, aryl, arylalkyl, heteroaryl and heteroarylalkyl. $R^5$ and $R^6$ may be linked to form a ring. More preferably, at least one of $R^5$ and $R^6$ comprises an optionally substituted $C_4$-$C_{20}$ alkyl or aryl group. Most preferably, $R^5$ and $R^6$ represent n-octyl.

Preferably, the hole transporting material has a HOMO level in the range of less than or equal to 5.5 eV, more preferably about 4.8 to 6 ev, still more preferably in the range 4.8 to 5.5 eV.

The semiconductive polymer comprised in the hole transporting material may comprise regions, each region having a HOMO energy level and a LUMO energy level that are distinct from the HOMO and LUMO energy level of the other regions. In view of the distinct HOMO and LUMO energy levels, each region is functionally distinct.

The semiconductive polymer may contain one or more hole transport regions, each hole transport region comprising at least one first repeat unit comprising a first nitrogen of a triarylamine in the polymer backbone and a second nitrogen of an arylamine pendent from the polymer backbone. The semiconductive polymer or a hole transport region in the semiconductive polymer preferably has a HOMO energy level of at least 4.8 eV, more preferably in the range 4.8 to 6 eV, still more preferably in the range 4.8 to 5.5 eV.

The backbone of the semiconductive polymer may have regions of conjugation. The regions of conjugation may be broken by regions of non-conjugation. The backbone may be fully conjugated. A conjugated region consists of one or more conjugated groups in the backbone.

Referring to FIG. 1, where the device is an LED, the LED will have an anode (2), a cathode (4) and a light emissive layer (3) located between the anode and the cathode. The anode may be, for example, a layer of transparent indium tin oxide. The anode is situated on a substrate (1). The cathode may be, for example, LiAl. Holes and electrons that are injected into the device recombine radiatively in the light emissive layer. A hole transport layer may be located between the anode and the light emissive layer. Optionally, a hole injection layer, such as a layer of polyethylene dioxythiophene (PEDOT), may be present between the hole transport layer and the anode. This provides an energy level which helps the holes injected from the anode to reach the hole transport layer and/or the light emitting layer. In particular, it is desirable to provide a conductive hole injection layer formed of a doped organic material. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. Nos. 5,723,873 and 5,798,170.

The LED also may have an electron transport layer situated between the cathode and a light emissive layer. This provides an energy level which helps the electrons injected from the cathode to reach the light emissive layer. If present, an electron transporting layer preferably has a LUMO level of around 3-3.5 eV.

The light emitting layer may itself comprise a laminate, effectively made up of sub-layers.

The light-emitting layer may consist of a light-emitting material alone or may comprise the light-emitting material in combination with one or more further materials. In particular, the light-emitting material may be blended with hole and/or electron transporting materials as disclosed in, for example, WO 99/48160. Alternatively, the light-emitting material may be covalently bound to a charge transporting material.

The light-emitting layer of the LED may comprise an electroluminescent material such as a fluorescent material and/or a phosphorescent material. When the light-emitting layer comprises a phosphorescent material, the phosphorescent material typically will be present together with a host material.

Many known phosphorescent materials comprise a heavy metal complex. Some fluorescent materials also comprise complexes of lighter metals for example Al.

Preferred electroluminescent materials comprise an electroluminescent polymer. Suitably, the electroluminescent polymer is semiconductive, more suitably the electroluminescent polymer is conjugated. Suitable electroluminescent polymers for use in the light-emitting layer include poly (arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers are disclosed in, for example, Adv. Mater. 2000 12(23) 1737-1750 and references therein.

An electroluminescent polymer or charge transport polymer preferably comprises a repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as C1-20 alkyl or alkoxy; electron withdrawing groups such as fluorine, nitro or cyano; and substituents for increasing glass transition temperature (Tg) of the polymer.

Particularly preferred electroluminescent and charge transport polymers comprise optionally substituted, 2,7-linked fluorenes, most preferably repeat units of formula as defined above.

In particular:
- a homopolymer of a fluorene repeat unit, such as a homopolymer of 9,9-dialkylfluorene-2,7-diyl, may be utilised to provide electron transport.
- a copolymer comprising a fluorene repeat unit and a triarylamine repeat unit, in particular a repeat unit selected from formulae 35 to 40, may be utilised to provide hole transport and/or emission:
- a copolymer comprising a fluorene repeat unit and heteroarylene repeat unit may be utilised for charge transport or emission. Preferred heteroarylene repeat units are selected from formulae 42-56:

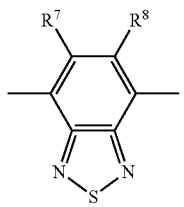
42 wherein $R^7$ and $R^8$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R^7$ and $R^8$ are preferably the same. More preferably, they are the same and are each a phenyl group.

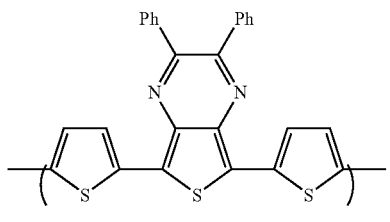
43

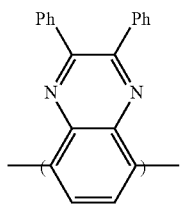
44

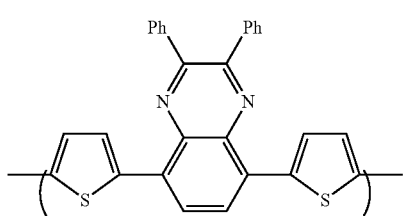
45

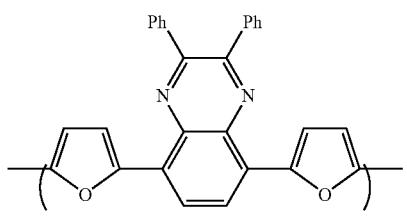
46

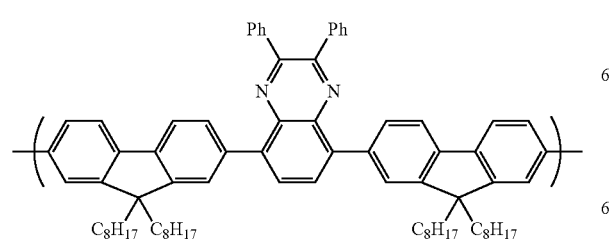
47

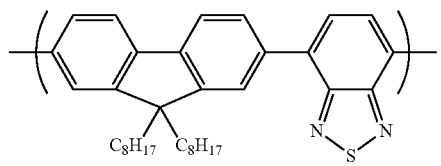
48

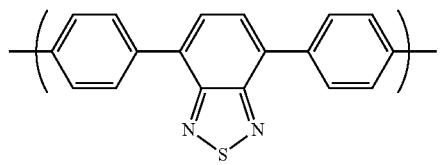
49

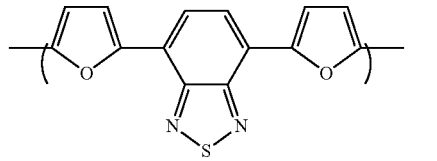
50

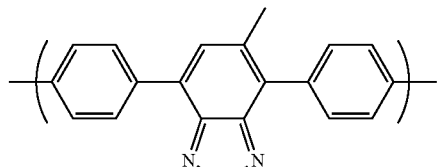
51

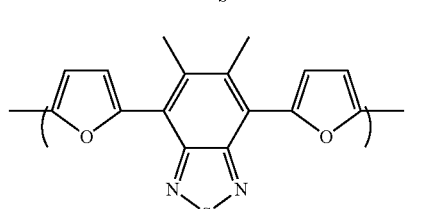
52

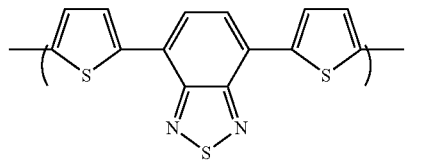
53

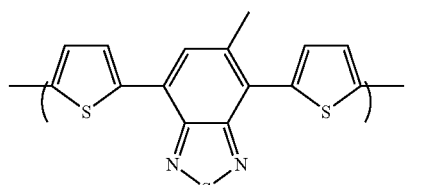
54

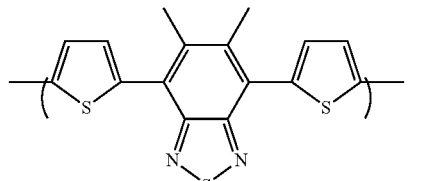
55

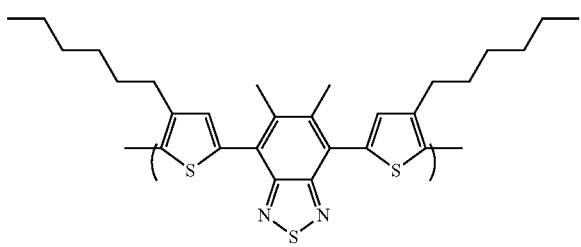

Electroluminescent copolymers may comprise an electroluminescent region and at least one of a hole transporting region and an electron transporting region as disclosed in, for example, WO 00/55927 and US 6353083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

The electroluminescent material may comprise an electroluminescent small molecule such as a metal complex. Numerous hosts for metal complexes are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenylnapthalimide] in Adv. Mater. 1999, 11(4), 285; and poly(para-phenylenes) in J. Mater. Chem. 2003, 13, 50-55. Copolymers are also known as hosts.

Preferred metal complexes comprise optionally substituted complexes of formula (57):

$$ML^1{}_qL^2{}_rL^3{}_s \qquad (57)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:
 lanthanide metals such as cerium, samarium, europium, terbium, dysprosium, thulium, erbium and neodymium; and
 d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (58):

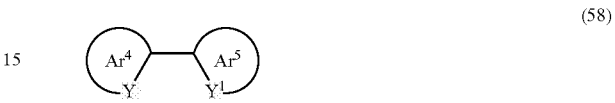

wherein $Ar^4$ and $Ar^5$ may be the same or different and are independently selected from optionally substituted aryl or heteroaryl; Y and $Y^1$ may be the same or different and are independently selected from carbon or nitrogen; and $Ar^4$ and $Ar^5$ may be fused together. Ligands wherein Y is carbon and $Y^1$ is nitrogen are particularly preferred.

Examples of bidentate ligands are illustrated below:

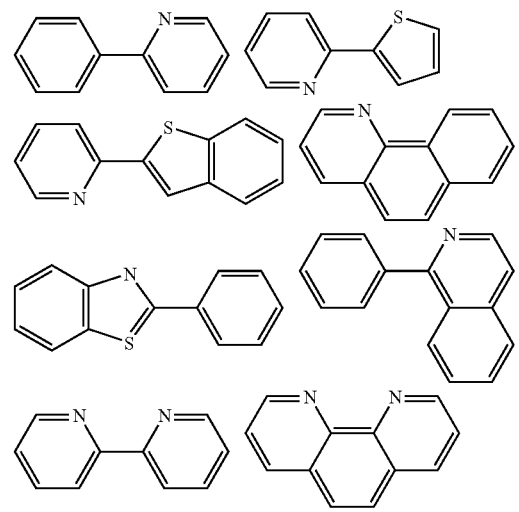

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. Nos. 5,150,006, 6,083,634 and 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

The cathode is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of a light-emitting layer and a cathode, however it will be appreciated that the device of the invention could also be formed by firstly forming a cathode on a substrate followed by deposition of a light-emitting layer and an anode.

The LED may have further layers in addition to those mentioned above. For example, the LED may have one or more charge or exciton blocking layers.

Many displays consist of a matrix of pixels, formed at the intersection of rows and columns deposited on a substrate. Each pixel is a light-emitting diode (LED), such as a polymer LED (PLED).

Coloured displays are formed by positioning matrices of red, green and blue pixels very close together. To control the pixels, and so form the image required, either 'passive' or 'active' matrix driver methods are used.

Active matrix displays incorporate a transistor (TFT) in series with each pixel which provides control over the current and hence the brightness of individual pixels. Lower currents can flow down the control wires since these have only to programme the TFT driver, and the wires can be finer as a result. Also, the transistor is able to hold the current setting, keeping the pixel at the required brightness, until it receives another control signal. DC driving conditions typically are used for an active matrix display.

In passive matrix displays, each row and each column of the display has its own driver, and to create an image, the matrix is rapidly scanned to enable every pixel to be switched on or off as required. The controlling current has to be present whenever the pixel is required to light up. Pulsed driving conditions typically are used for a passive matrix display.

In the present invention, both continuous (i.e. DC) and pulsed driving conditions may be used, i.e. for actively and passively addressed displays respectively. The present invention may also be used for non-display applications, for example ambient lighting.

The present device may be comprised in a display such as a passive matrix display. Alternatively, the device may be comprised in an active matrix display driven by DC driving conditions.

Preferred methods for preparation of the semiconductive polymer comprising a first nitrogen of a triarylamine in the polymer backbone and a second nitrogen of an arylamine pendant from the polymer backbone are Suzuki polymerisation as described in, for example, WO 00/53656 and Yamamoto polymerisation as described in, for example, T. Yamamoto, "Electrically Conducting And Thermally Stable n-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group $(L,L^1)$ of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups (L and $L^1$) is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units comprising aryl groups as illustrated throughout this application each may be derived from a monomer carrying a suitable leaving group(s) (L and $L^1$).

In the case of an end capping monomer, the monomer will be equivalent to the first repeat unit having a leaving group at one terminal and an inert group such as hydrogen at the other terminal.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include tosylate, mesylate, phenyl sulfonate and triflate.

A single polymer or a plurality of polymers may be deposited from solution. Suitable solvents for organic semiconductive polymers such as polyarylenes, in particular polyfluorenes, include mono- or poly-alkylbenzenes such as toluene and xylene. Particularly preferred solution deposition techniques are spin-coating, inkjet printing and roll printing.

Spin-coating is particularly suitable for devices wherein patterning of the light-emitting material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

EXAMPLE 1

Preparation of Monomer 1 and Polymer 1

Synthetic Route to Monomer 1:

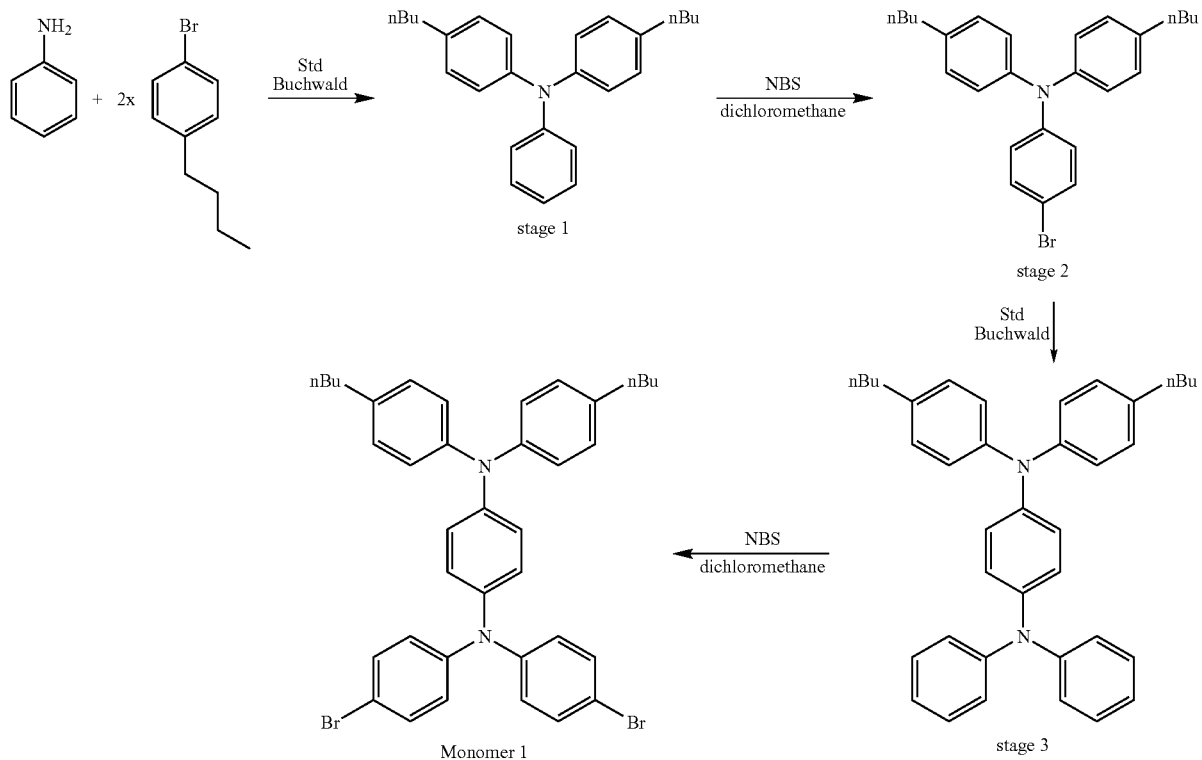

Stage 1
Apparatus-setup

3 L round-bottomed 3 neck flask, equipped with a mechanical stirrer, reflux condenser, nitrogen inlet and exhaust.

Aniline (19.86 g, 0.214 mol) and 4-bromo-n-butylbenzene (100.0 g, 0.469 mol) were placed in a 3 L round-bottomed 3 neck flask. 1 L toluene was added and the flask was equipped with a mechanical stirrer and a reflux condenser. Nitrogen was bubbled through the mixture via a pipette for 60 min. The catalyst, tris(dibenzylideneacetone) dipalladium (0.98 g, 1.07 mol), and the ligand, tri-tert-butylphosphine trifluoroborate (0.465 g, 1.6 mmol) were then added and the reaction mixture was stirred for 15 min under a nitrogen atmosphere. The reaction mixture was cooled with an ice-bath and sodium tert-butoxide (61.5 g, 0.64 mol) was added portion-wise. Care had to be taken, as the reaction was exothermic. The mixture was stirred at room temperature for 4 hours and then heated to 80° C. (oil bath temperature) overnight. Water (1 L) was added to quench the reaction, and the phases were separated in a separatory funnel. The organic phase was reduced on a rotary evaporator to yield a dark-brown oil. The oil was diluted with toluene (100 mL) and filtered through a Silica plug (Ø=10 cm, 15 cm height). The plug was eluted with toluene (4.5 L). The filtrate was reduced by rotary evaporation to give 122 g of a coloured oil, which contains the bis(4-n-butylphenyl)phenyl amine; it was used in the next step without further purification.

Stage 2

Apparatus-setup

5 L round bottomed 3-neck flask equipped with an internal thermometer with holder, magnetic stirrer and nitrogen inlet and exhaust.

A 5 L round-bottomed 3-neck flask was charged with crude N11 stage 1 (244.5 g, contains 0.64 mol theoretical). 2.5 L dichloromethane were added and the flask was flushed with nitrogen. The mixture was cooled to <10° C. with the aid of an ice bath. N-bromosuccinimide (127.8 g, 0.72 mol) was added portion-wise keeping the temperature below 10° C. The reaction mixture was left to warm-up to room temperature overnight. It was then filtered through a plug of Celite. The plug was eluted with dichloromethane (2 L). The filtrate was evaporated to dryness to yield 250 g of crude stage 2 material.

Impurities (mainly bromo-n-butylbenzene) were removed by high vacuum distillation and the residue (230 g, 78% yield) used without further purification in the next step.

Stage 3

Apparatus-setup

2 L round-bottomed 3-neck flask equipped with a reflux condenser, mechanical stirrer and nitrogen inlet and exhaust.

Stage 2 material (50 g, 0.11 mol) was placed in a 2 L round-bottomed 3-neck flask equipped with a reflux condenser, mechanical stirrer and nitrogen inlet and exhaust. It was dissolved in 750 mL toluene. Nitrogen was bubbled through the mixture via a pipette for 60 min. Palladium acetate (0.74 g, 3.3 mmol) and tri(o-tolyl)phosphine (2.5 g, 6.6 mmol) were added and the mixture was stirred for 15 min under nitrogen. The base, sodium tert-butoxide, (28.8 g, 0.30 mol) was added portion-wise and mixture was heated to reflux overnight. The mixture was poured onto water (2 L) and the mixture filtered through a plug of Celite to help phase separation. The organic phases were separated, dried over magnesium sulphate and reduced by rotary evaporation to dryness. The solid obtained was recrystallized from 2-propanol to yield 63 g of stage 3 material, which was sufficiently pure to be used in the following step.

Monomer 1

Apparatus-setup

2 L round-bottomed 3-neck flask equipped magnetic stirrer bar and nitrogen inlet and exhaust.

EXPERIMENTAL

In a 2 L round-bottomed 3-neck flask stage 3 material (77.8 g, 0.15 mol) was dissolved in dichloromethane (750 mL). The flask was then flushed with nitrogen. The mixture was cooled with an ice bath to <10° C. and N-bromosuccinimide (52.8 g, 0.30 mol) was added portion-wise, keeping the temperature below 10° C. The mixture was stirred overnight. The mixture was filtered through a Silica plug and eluted with dichloromethane (2 L). The filtrate was evaporated to yield an oil. The oil was dissolved in 2 L 2-propanol and slowly cooled to room temperature to give a precipitate. The precipitate was filtered off and the dissolving, cooling and filtration steps were repeated 2 further times. The product was recrystallized from hexane and was dried at 40° C. in the vacuum to yield 18.33 g (18% yield). The combined filtrates were reduced under vacuum and recrystallized to yield further product.

$^1$H—NMR (CDCl$_3$, 400 MHz): δ[ppm]0.93 (6H, t, J=7.4 Hz), 1.32-1.41 (4H, m), 1.55-1.59 (4H, m), 2.56 (4H, t, J=7.6 Hz), 6.89-7.06 (16H, m); 7.31 (4H, d, J=8.8 Hz).

Polymer 1 according to the invention comprising 85 mol % 9,9-dioctylfluoren-2,7-diyl repeat units and 15 mol % Monomer 1 repeat units was prepared by Suzuki polymerisation according to the method described in WO 00/53656.

EXAMPLE 2

Preparation of a Light-emitting Device (Device 1)

Poly(ethylene dioxythiophene)/poly(styrene sulfonate) (PEDT/PSS), available from H C Starck of Leverkusen, Germany as Baytron P® was deposited over an indium tin oxide anode supported on a glass substrate (available from Applied Films, Colorado, USA) by spin coating. A hole transporting layer of polymer 1 prepared in Example 1 was deposited over the PEDT/PSS layer by spin coating from xylene solution to a thickness of about 30 nm and heated at 180° C. for 1 hour. A blue electroluminescent polymer as disclosed in WO 04/083277 was deposited over the layer of polymer 1 by spin-coating from xylene solution to a thickness of around 65 nm. A Ba/Al cathode is formed over the layer of electroluminescent polymer by evaporating a first layer of barium to a thickness of up to about 10 nm and a second layer of aluminium barium to a thickness of about 100 nm over the semiconducting polymer. Finally, the device was sealed using a metal enclosure containing a getter that is placed over the device and glued onto the substrate in order to form an airtight seal.

For the purpose of comparison, a second device (Device 2) was prepared according to the above method except that Polymer 2 comprising 85 mol % dioctylfluorene repeat units and 15 mol % of the diamine "PFB" repeat unit, as disclosed in WO 99/54385, was used in place of Polymer 1.

Lifetimes of Devices 1 and 2 were measured and the results are summarised in Table 1 below.

TABLE 1

| Device | | Luminance (cd/m$^2$) | Lifetime (hours) |
|---|---|---|---|
| Device 2 | Polymer 2 | 1600 | 277 |
| Device 1 | Polymer 1 | 1600 | 329 |

Device 1 showed a 16% higher lifetime than Device 2.

EXAMPLE 3

Data Comparing Polymers 3 and 4

Polymer 3 according to the invention containing 30 mol % Monomer 1 and 70 mol % dioctylfluorene was prepared in accordance with the method of Example 1. For the purpose of comparison, Polymer 4 containing 30 mol % PFB and 70 mol % dioctylfluorene was prepared.

Lifetimes of Devices 3 and 4 were measured and the results are summarised in Table 2 below.

TABLE 2

| Device | | Luminance (cd/m$^2$) | Average lifetime (hours) |
|---|---|---|---|
| 3 | Polymer 3 | 1600 | 234.5 |
| 4 | Polymer 4 | 1600 | 193.3 |

Device 3 showed a 16% higher lifetime than Device 4.

The invention claimed is:

1. An electronic device containing a hole transporting semiconductive polymer comprising a first repeat unit comprising a first nitrogen of a triarylamine in the polymer backbone and a second nitrogen of an arylamine pendant from the polymer backbone, wherein said device comprises an organic light-emitting device, wherein said semiconductive polymer is comprised in a hole transport layer of the device, wherein said semiconductive polymer performs the function of transporting holes to a light-emitting semiconductive material in an emissive layer of said organic light-emitting device, and wherein the device emits blue light, wherein the first repeat unit comprises general formula 1:

(1)

where $Ar_1$, $Ar_2$, $Ar_3$, $Ar_4$ and $Ar_5$ each independently represent an aryl or heteroaryl ring or a fused derivative thereof; and X represents a spacer group.

2. A device according to claim 1, wherein one or both of $Ar_1$ and $Ar_2$ represents an electron rich aryl or heteroaryl ring or a fused derivative thereof.

3. A device according to claim 2, wherein $Ar_1$ and $Ar_2$ both independently represent phenyl.

4. A device according to claim 1, wherein one or both of $Ar_4$ and $Ar_5$ represents an electron rich aryl or heteroaryl ring or a fused derivative thereof.

5. A device according to claim 4, wherein $Ar_4$ and $Ar_5$ both independently represent phenyl.

6. A device according to claim 5, wherein $Ar_4$ and/or $Ar_5$ represents a substituted phenyl ring with one substituent, said one substituent being located at the para position.

7. A device according to claim 1, wherein $Ar_3$ represents phenyl or a fused derivative thereof.

8. A device according to claim 1, wherein the triarylamine containing the first nitrogen is in conjugation with the arylamine containing the second nitrogen.

9. A device according to claim 1, wherein the polymer contains from 15% to 30 mol % of the first repeat unit.

10. A device according to claim 1, wherein the device is comprised in a pulse-driven display.

11. An electronic device containing a hole transporting semiconductive polymer comprising a first repeat unit comprising a first nitrogen of a triarylamine in the polymer backbone and a second nitrogen of an arylamine pendant from the polymer backbone, wherein said device comprises an organic light-emitting device, wherein said semiconductive polymer is comprised in a hole transport layer of the device, wherein said semiconductive polymer performs the function of transporting holes to a light-emitting semiconductive material in an emissive layer of said organic light-emitting device, and wherein the device emits blue light, wherein the first repeat unit comprises general formula 20:

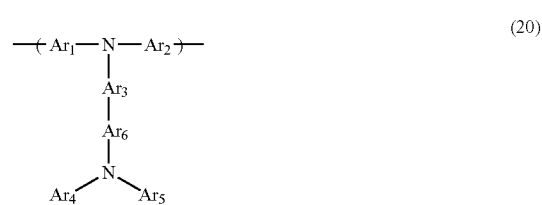

(20)

where $Ar_1$ $Ar_2$ $Ar_3$ $Ar_4$ $Ar_5$ and $Ar_6$ each independently represent an aryl or heteroaryl ring or a fused derivative thereof.

12. A device according to claim 1, wherein the first repeat unit comprises general formula 17:

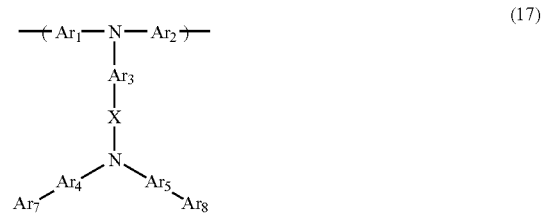

(17)

where $Ar_7$, and $Ar_8$ each independently represent an aryl or heteroaryl ring or a fused derivative thereof.

13. A device according to claim 11, wherein the first repeat unit comprises a general formula selected from the group consisting of formulae 12, 13, 14, and 15:

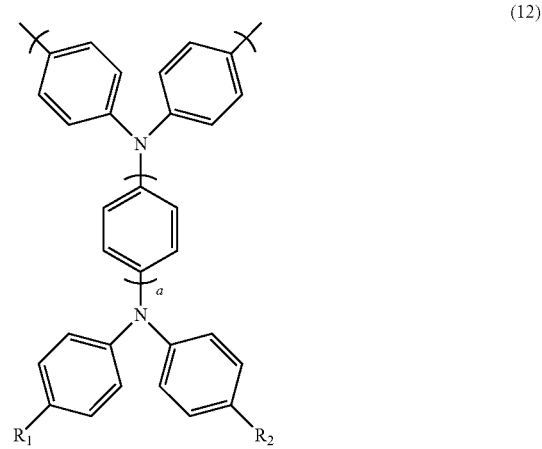

(12)

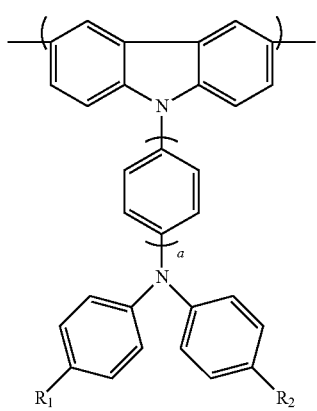

(13)

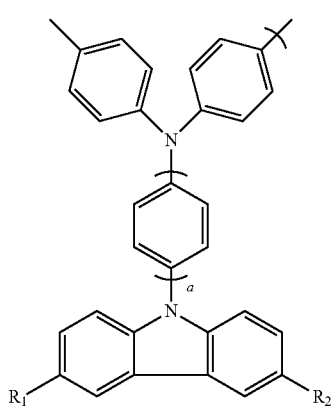

(14)

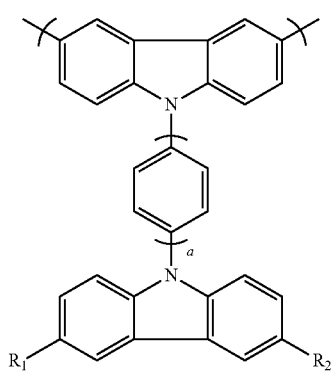

(15)

where a=2 or 3 and $R_1$ and $R_2$ each independently represent a substituent.

14. A device according to claim 11, wherein the first repeat unit comprises general formula 22:

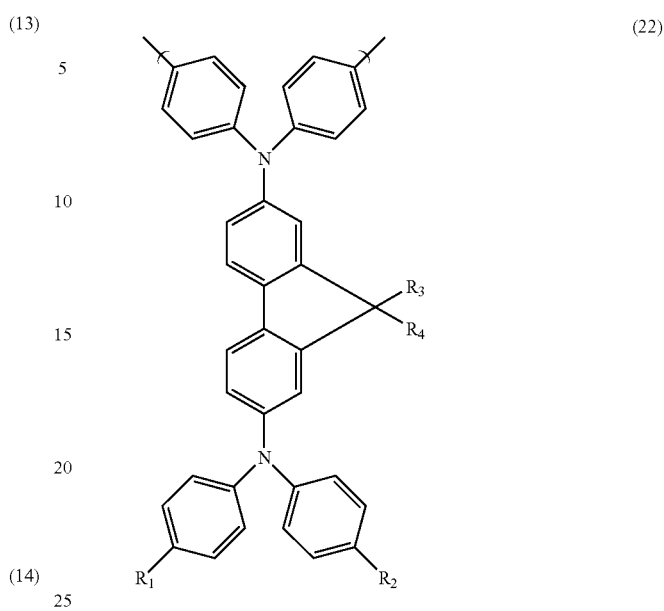

(22)

where $R_1$, $R_2$, $R_3$ and $R_4$ each independently represent a substituent group.

15. An electronic device containing a hole transporting semiconductive polymer comprising a first repeat unit comprising a first nitrogen of a triarylamine in the polymer backbone and a second nitrogen of an arylamine pendant from the polymer backbone, wherein said device comprises an organic light-emitting device, wherein said semiconductive polymer is comprised in a hole transport layer of the device, wherein said semiconductive polymer performs the function of transporting holes to a light-emitting semiconductive material in an emissive layer of said organic light-emitting device, and wherein the device emits blue light, wherein the first repeat unit comprises a group having general formula 23:

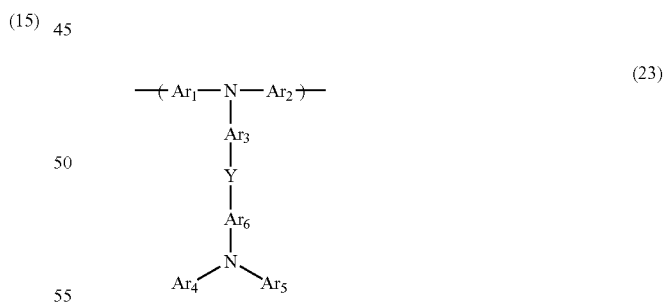

(23)

where $Ar_1$, $Ar_2$, $Ar_3$, $Ar_4$, $Ar_5$ and $Ar_6$ each independently represent an arly or heteroaryl ring or a fused derivative thereof and Y represents an electron donating group.

16. A device according to claim 1, wherein the first repeat unit further contains a further arylamine containing a third nitrogen.

17. A device according to claim 16, wherein the first repeat unit comprises general formula 28:

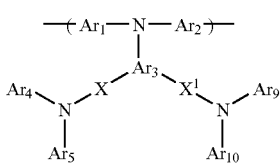
(28)

where $X^1$ represents an optional spacer group; and $Ar_9$ and $Ar_{10}$ each independently represent an aryl or heteroaryl ring or a fused derivative thereof.

18. A device according to claim 17, wherein the first repeat unit comprises general formula 29:

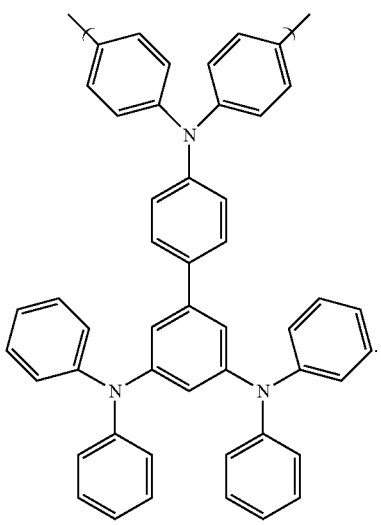
(29)

19. A device according to claim 16, wherein the first repeat unit further contains a further arylamine containing a fourth nitrogen.

20. A device according to claim 19, wherein the first repeat unit comprises general formula 30:

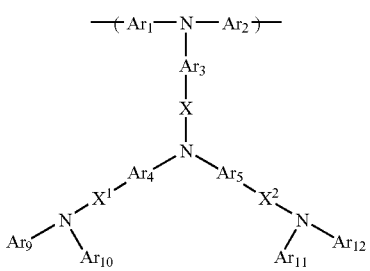
(30)

where $X^1$ and $X^2$ independently represent optional spacer groups; and $Ar_9$, $Ar_{10}$, $Ar_{11}$ and $Ar_{12}$ each independently represent an aryl or heteroaryl ring or a fused derivative thereof.

21. A device according to claim 20, wherein the first repeat unit comprises general formula 31:

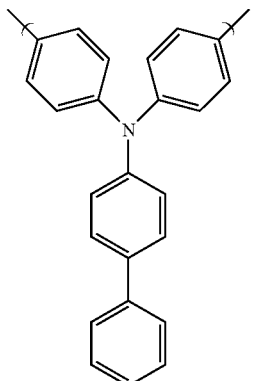
(31)

22. A device according to claim 19, wherein the first repeat unit comprises general formula 32:

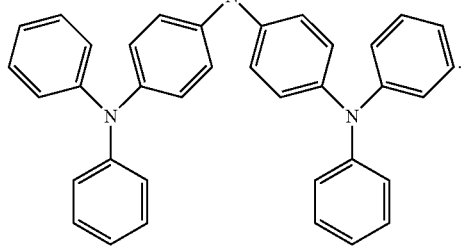
(32)

where $X^1$ represents an optional spacer group; and $Ar_9$, $Ar_{10}$, $Ar_{11}$ and $Ar_{12}$ each independently represent an aryl or heteroaryl ring or a fused derivative thereof.

23. A method of manufacturing an electronic device containing a hole transporting semiconductive polymer comprising a first repeat unit comprising a first nitrogen of a triarylamine in the polymer backbone and a second nitrogen of an arylamine pendant from the polymer backbone, wherein said device comprises an organic light-emitting device, wherein said semiconductive polymer is comprised in a hole transport layer of the device, wherein said semiconductive polymer performs the function of transporting holes to a light-emitting semiconductive material in an emissive layer of said organic light-emitting device, and wherein the device emits blue light, wherein the first repeat unit comprises general formula 1:

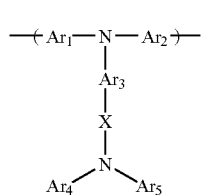 (1)

where $Ar_1$, $Ar_2$, $Ar_3$, $Ar_4$ and $Ar_5$ each independently represent an aryl or heteroaryl ring or a fused derivative thereof; and X represents a spacer group, the method including depositing a solution of the hole transporting semiconductive polymer to form a layer comprising the semiconductive polymer.

24. A method according to claim 23, further including crosslinking the layer comprising the semiconductive polymer and then depositing a subsequent layer thereon.

25. A method according to claim 23, further including treating the layer comprising the semiconductive polymer by heat, vacuum or ambient drying to render the layer at least partially insoluble and then depositing a subsequent layer thereon.

26. A device according to claim 1, wherein the semiconductive polymer comprises a copolymer or higher order polymer containing a co-repeat unit comprising a 2,7-linked fluorene group.

\* \* \* \* \*